United States Patent
Yancey et al.

(10) Patent No.: US 7,587,441 B2
(45) Date of Patent: Sep. 8, 2009

(54) SYSTEMS AND METHODS FOR WEIGHTED OVERLAP AND ADD PROCESSING

(75) Inventors: Jerry W. Yancey, Greenville, TX (US); Yea Z. Kuo, Rockwall, TX (US)

(73) Assignee: L-3 Communications Integrated Systems L.P., Greenville, TX (US)

( * ) Notice: Subject to any disclaimer, the term of this patent is extended or adjusted under 35 U.S.C. 154(b) by 837 days.

(21) Appl. No.: 11/170,794

(22) Filed: Jun. 29, 2005

(65) Prior Publication Data

US 2007/0005830 A1 Jan. 4, 2007

(51) Int. Cl.
*G06F 17/10* (2006.01)
(52) U.S. Cl. ..................... 708/319
(58) Field of Classification Search ......... 708/319
See application file for complete search history.

(56) References Cited

U.S. PATENT DOCUMENTS

| | | | |
|---|---|---|---|
| 5,543,835 A * | 8/1996 | Mumura | 348/207.99 |
| 5,606,575 A | 2/1997 | Williams | |
| 5,930,231 A | 7/1999 | Miller et al. | |
| 5,986,715 A * | 11/1999 | Ikeyama et al. | 348/441 |
| 6,018,707 A | 1/2000 | Nishiguchi et al. | |
| 6,236,731 B1 | 5/2001 | Brennan et al. | |
| 6,240,192 B1 | 5/2001 | Brennan et al. | |
| 6,532,443 B1 | 3/2003 | Nishiguchi et al. | |
| 2002/0059352 A1 * | 5/2002 | Nakase et al. | 708/316 |
| 2003/0110033 A1 | 6/2003 | Sheikhzadeh-Nadjar et al. | |
| 2003/0130848 A1 | 7/2003 | Sheikhzadeh-Nadjar et al. | |

FOREIGN PATENT DOCUMENTS

| | | |
|---|---|---|
| WO | WO97/36390 | 10/1997 |
| WO | WO03/015275 A1 | 2/2003 |
| WO | WO03/036616 A1 | 5/2003 |
| WO | WO03/036618 A1 | 5/2003 |

OTHER PUBLICATIONS

RFEL Core Architecture; RFEL: Models-Pipelined FFT (Vectis Range); http://www.rfel.com/products/mod_vectis.asp; printed from the Internet May 17, 2005; 3 pgs.
RFEL Core Architecture; RF Engines Limited Data Sheet; Rev. 1.0; Oct. 4, 2002, 18 pgs.

(Continued)

*Primary Examiner*—David H Malzahn
(74) *Attorney, Agent, or Firm*—O'Keefe, Egan, Peterman & Ender LLP

(57) ABSTRACT

Systems and methods for providing a weighted overlap and add (WOLA) architecture and/or for providing polyphase WOLA FFT processing that may be employed, for example, for separation or channelization of closely-spaced frequencies of an input signal. A WOLA architecture that may be implemented as first-in-first-out (FIFO) cores in an FPGA or ASIC device. The FIFO cores may be pre-existing (e.g., provided as free FIFO cores in a commercial off the shelf (COTS) FPGA device) or may be custom-programmed into a custom ASIC device.

41 Claims, 6 Drawing Sheets

OTHER PUBLICATIONS

RFEL Core Architecture; FFT Cores for FPGA; Product Information Sheet; Version 1.0; available prior to Jun. 29, 2005 filing date of the present patent application; 11 pgs.

Pucker et al., "Channelization Techniques For Software Defined Radio"; printed from the Internet May 31, 2005; 6 pgs.

Search Report, PCT/US06/24450, Feb. 6, 2008, 2 pgs.

Wikipedia Encyclopedia, Flip-Flop (electronics), Printed from Internet Mar. 17, 2009, 10 pgs.

Wikipedia Encyclopedia, FIFO (computing), Printed from Internet Mar. 18, 2009, 4 pgs.

* cited by examiner

SYSTEMS AND METHODS FOR WEIGHTED OVERLAP AND ADD PROCESSING

FIELD OF THE INVENTION

This invention relates generally to signal processing, and more particularly to signal processing using weighted overlap and add processing.

BACKGROUND OF THE INVENTION

Fast fourier transform (FFT) algorithms have been employed in the past to separate an input signal into component frequencies and to combine separate frequencies into a single signal. Polyphase FFT channelizers employ polyphase filtering and FFT processing to separate and decimate multiple channels of an input signal for further processing of the individual signals. Polyphase FFT processing has been performed in the past using finite impulse response (FIR) filter banks that employ a FIR filter for each output bin of an FFT stage. This architecture can be very complex for large FFT sizes. Polyphase FFT processing has also been performed in the past using weighted overlap-and-add (WOLA) methodologies. Polyphase FFT processing has been implemented in IP core logic of application specific integrated circuit (ASIC) and field programmable gate array (FPGA) devices.

SUMMARY OF THE INVENTION

Disclosed are systems and methods for providing WOLA processing and, in one embodiment for providing a WOLA architecture for polyphase FFT processing, such as for separation or channelization of closely-spaced frequencies of an input signal. The disclosed WOLA architecture may be implemented, for example, using first-in-first-out (FIFO) cores in an integrated circuit such as FPGA or ASIC device. In one embodiment, suitable FIFO cores may be pre-existing within an integrated circuit (e.g., provided as free FIFO cores in a commercial off the shelf (COTS) FPGA device) or may be custom-programmed into a custom ASIC device. In either case, the disclosed WOLA architecture may be advantageously implemented in one embodiment for polyphase FFT processing in a modular and flexible manner that minimizes integrated circuit resource utilization, and in one embodiment that maps readily onto the pre-existing circuitry of most COTS FPGA devices.

In one embodiment, the disclosed WOLA architecture may be implemented for polyphase FFT in a scaleable manner that minimizes the use of large multiplexers. In this regard, the disclosed systems and methods may be implemented in a manner that avoids the use of multiplexers with large numbers of inputs, and without the need for controlling and addressing multiple banks of memory. The disclosed systems and methods may also employ FIFO buffering to simplify the control and addressing of memories required for WOLA operations, and FIFO recirculation methodology may be employed to simplify the handling of weight values and/or weight value ranges. Relatively easy scalability may be provided by using a modular design that is based on a relatively simple repeated module which supports a variety of FFT sizes, polyphase orders, overlap percentages and window functions.

In one respect, disclosed herein is a weighted overlap and add (WOLA) sub-module, including: a first First-In First-Out (FIFO) buffer having an input and an output; a weight value source having an output; and a multiplier having a first input coupled to the output of the first FIFO buffer, a second input coupled to the output of the weight value source, and an output configured to be coupled to a summer.

In another respect, disclosed herein is a signal processing system, including a first weighted overlap and add (WOLA) sub-module, a second WOLA sub-module, and a summer. The first WOLA sub-module may include a first First-In First-Out (FIFO) buffer having an input and an output; a first weight value source having an output; and a first multiplier having a first input coupled to the output of the first FIFO buffer, a second input coupled to the output of the weight value source, and an output. The second WOLA sub-module, may include a second FIFO buffer having an input and an output, the input of the second FIFO buffer being coupled to the output of the first FIFO buffer; a second weight value source having an output; and a second multiplier having a first input coupled to the output of the second FIFO buffer, a second input coupled to the output of the second weight value source, and an output. The summer may have a first input coupled to the output of the first multiplier, a second input coupled to an output of the second multiplier, and an output.

In another respect, disclosed herein is a weighted overlap and add (WOLA) processing system, including: a first First-In First-Out (FIFO) buffer configured to temporarily store sample input frames, the first FIFO buffer having an input configured to receive the sample input frames, and an output configured to provide the sample input frames temporarily stored by the first FIFO buffer; and a first multiplier coupled to the output of the first FIFO buffer, the first multiplier being configured to receive a first weight value range from a first weight value source. The output of the first FIFO buffer may be configured to provide the sample input frames temporarily stored by the first FIFO buffer to the first multiplier; and the first multiplier may be configured to multiply the sample input frames provided by the first FIFO buffer by the first weight value range to obtain a first product.

In another respect, disclosed herein is a method of performing WOLA processing on sample input frames of a digital signal, the method including: receiving and temporarily storing a first sample input frame of the digital signal in a first First-In First-Out (FIFO) buffer during a first calculation cycle; providing the temporarily stored first sample input frame from the first FIFO buffer during a second calculation cycle following the first calculation cycle; and multiplying the first sample input frame provided by the first FIFO buffer by a first weight value range to obtain a first product during the second calculation cycle.

DESCRIPTION OF ILLUSTRATIVE EMBODIMENTS

Figure 1:
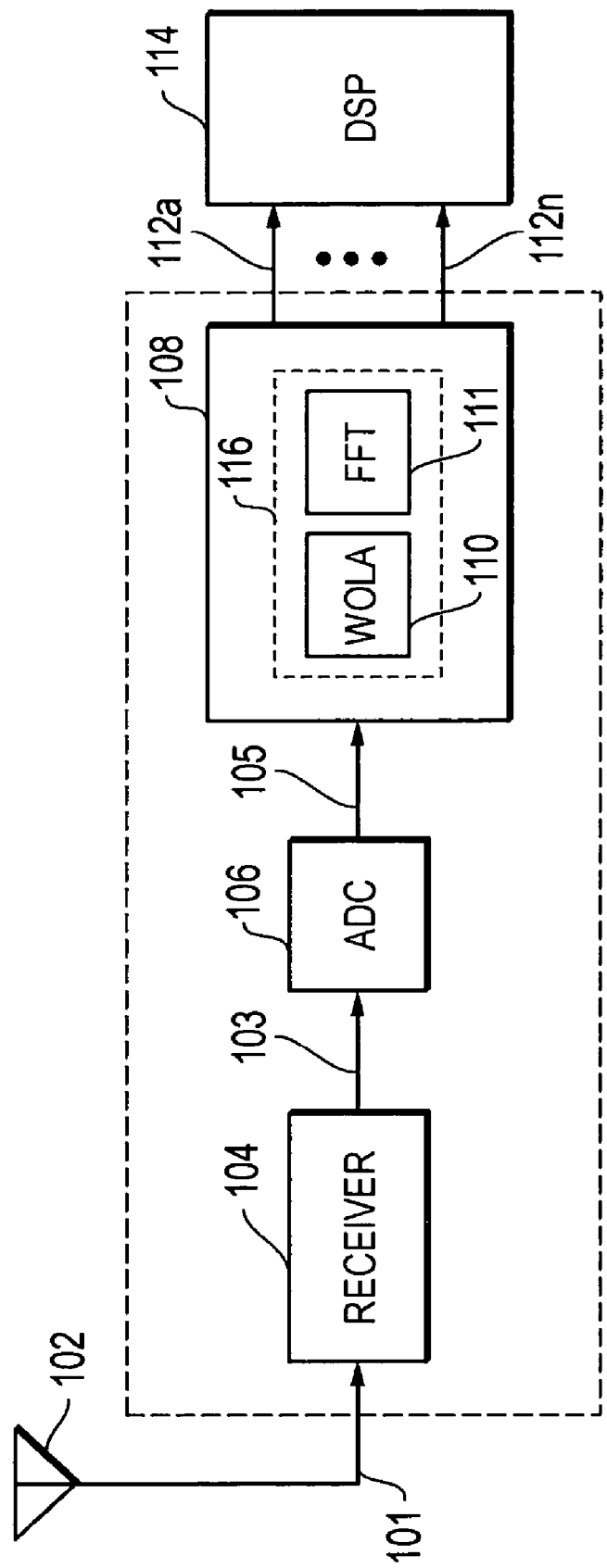
FIG. 1 is a simplified block diagram of receive and channelization circuitry coupled to an antenna according to one exemplary embodiment of the disclosed systems and methods.

FIG. 1 illustrates one exemplary embodiment of the disclosed systems and methods as it may be implemented as part of receive and channelization circuitry 100 that is coupled to receive and channelize radio frequency (RF) information 101 received from a sensor in the form of an antenna 102. Receive and channelization circuitry 100 is illustrated configured as a receive-only system in FIG. 1 that is configured to separate received analog RF information into one or more separate components or frequencies for further processing. It is possible that more than one sensor (e.g., antenna 102) may be coupled to one or more sets of receive and channelization circuitry 100, and/or that antenna 102 may be a single element antenna or an antenna array. It will also be understood that in other embodiments the disclosed systems and methods may be alternatively implemented in a system configured as a transmitter or transceiver, in which case channelization circuitry may be configured to combine separate components or frequencies into a combined digital signal for conversion to analog form and transmission as an analog RF signal via an antenna or other suitable transmission component.

As shown in FIG. 1, antenna 102 is coupled to analog receiver circuitry 104 of receive and channelization circuitry 100. In this exemplary embodiment, analog receiver circuitry 104 receives RF information 101 from antenna 102 that may contain multiple components, e.g., multiple RF frequencies. Analog receiver circuitry 104 provides this received RF information as received RF signal 103 in analog form (e.g., either as an intermediate frequency (IF) or as baseband (detected/demodulated)) to analog to digital converter (ADC) 106, which in turn provides the received RF signal in digital form 105 to channelizer 108. Channelizer 108 includes polyphase WOLA FFT processing circuitry 116 (e.g., implemented with ASIC, FPGA, or other suitable processing circuitry/components) that includes WOLA processor 110 and FFT processor 111. Although not shown, it will be understood that channelizer 108 may also include an optional second-stage digital receiver, e.g., digital drop receiver for two-stage down conversion. In the illustrated embodiment, channelizer 108 is configured to use polyphase WOLA FFT processing circuitry components 110 and 111 to separate signal 105 into multiple channels 112a to 112n that correspond to multiple components of received RF information 101.

In FIG. 1, channelizer 108 of receive an channelization circuitry 100 is shown configured to provide multiple channels 112a to 112n to a single digital signal processor (DSP) 114 for further processing. It will be understood that separate channels 112a to 112n may be provided simultaneously by channelizer 108 or that a subset (e.g., only one) of separate channels 112 may be preferentially or selectably provided by channelizer 108 to DSP 114. It will also be understood that each of channels 112a to 112n may alternatively be provided to a separate and different DSP from the other channels, and/or may be provided to any other type of processing circuitry configured as needed or desired to fit the characteristics of a given signal processing application.

It will be understood that the illustrated embodiment of FIG. 1 is exemplary only, and that any other configuration of circuitry and/or sensor/s may be employed that is suitable for accomplishing channelization of an input RF signal according to the polyphase WOLA FFT processing methodology disclosed herein. Furthermore, although FIG. 1 illustrates one exemplary embodiment configured for WOLA FFT processing of received RF signals, it will be understood that the disclosed systems and methods may be configured for implementation in any other polyphase FFT signal processing application, e.g., for the separation of an input signal into one or more individual signal components. Examples of other such polyphase FFT signal processing applications include, but are not limited to, image processing, speech processing, beamforming, spectography, etc.

Figure 2A:
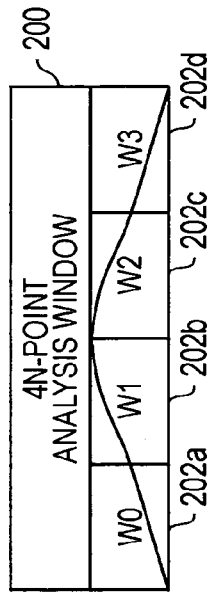
FIG. 2A is a representation of an analysis window according to one exemplary embodiment of the disclosed systems and methods.

FIG. 2A shows an analysis window 200 that may be implemented for a fourth order WOLA processing scheme in one exemplary embodiment of the disclosed systems and methods prior to FFT processing. Analysis window 200 may be implemented, for example, by WOLA processor 110 prior to providing the results of this analysis to FFT processor 111 of FIG. 1. As shown, analysis window 200 includes four equal weight ranges (W0, W1, W2 and W3) labeled as 202a through 202d in FIG. 2A, and that may be used to define a distribution for analysis window 200, e.g., in the manner shown. However, it will be understood that the number of weight ranges may be varied (e.g., may be less than four or may be greater than four) as needed or desired to fit the characteristics of a given application. It will also be understood that although each weight value range has the same number of weight values, the number of weight values in a range may vary. The weight values in each of weight ranges 202a through 202d may be selected (e.g., by a system user) to achieve a desired analysis window distribution and/or behavioral characteristics of polyphase WOLA FFT processing circuitry (e.g., polyphase WOLA FFT processing circuitry 116 of FIG. 1). It will be understood that the illustrated fourth order analysis window 200 is exemplary only, and that any other suitable analysis window configuration may be employed in the practice of the disclosed systems and methods, e.g., 3-term and 4-term Blackman-Harris, Kaiser, Nuttall, etc.

Figure 2B:
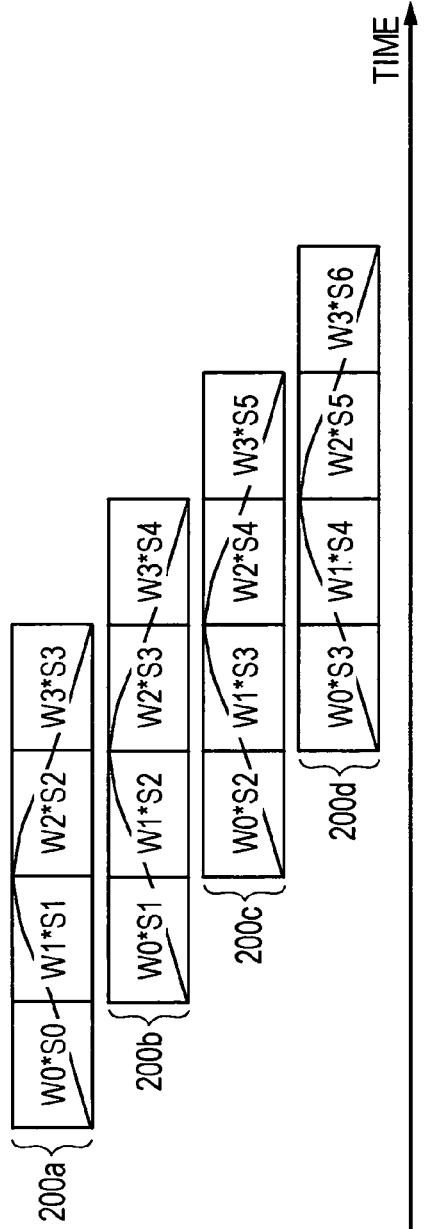
FIG. 2B illustrates progression of sample input frames within an analysis window according to one exemplary embodiment of the disclosed systems and methods.

FIG. 2B illustrates progression of sample input frames (S0, S1, S2, S3, S4, S5 and S6) labeled as 204a through 204g versus time within corresponding analysis window 200 of FIG. 2A. As shown in FIG. 2B, each of sample input frames 204 is multiplied by each of four weight value ranges (W0, W1, W2 and W3) labeled as 202a through 202d, i.e., each successive sample in a sample input frame 204 is multiplied within analysis window 200 by each successive weight value from a corresponding weight value range 202 at a given time (t), and the resulting product then added to the products of three other sample input frames 204 and the three other weight value ranges 202 of analysis window 200 at the same time (t) as shown.

FIG. 2B depicts the relation of sample input frames 204 relative to analysis window 200 at four consecutive times as analysis window positions 200a through 200d. Specifically, at a first time corresponding to analysis window position 200a, sample input frames S0, S1, S2 and S3 are present within analysis window 200 and are shown multiplied by weight value ranges W0, W1, W2 and W3, respectively. The resulting products (i.e., W0*S0, W1*S1, W2*S2 and W3*S3) may then be summed together for window position 200a and then employed in FFT processing. At a second and subsequent time corresponding to analysis window position 200b, sample input frames S1, S2, S3 and S4 are present within analysis window 200 and are shown multiplied by weight value ranges W0, W1, W2 and W3, respectively. As before, the resulting products (i.e., W0*S1, W1*S2, W2*S3 and W3*S4) may then be summed together for window position 200b and then employed in FFT processing. This progression continues for subsequent sample input frames, e.g., as illustrated by analysis window positions 200c and 200d in FIG. 2B, it being understood that the process may continue as long as additional sample input frames 204 are provided, i.e., past sample input frame S6.

In the illustrated embodiment of FIG. 2B, a 75% data overlap is obtained by multiplying and summing the contents of analysis window 200 after each consecutive new sample input frame 204 is received within analysis window 200. However, it will be understood that data overlap may be varied as needed or desired to fit the characteristics of a given application, e.g., a 50% data overlap may be obtained by multiplying and summing the contents of analysis window 200 only after every other new sample input frame 204 is received within analysis window 200.

Figure 3:
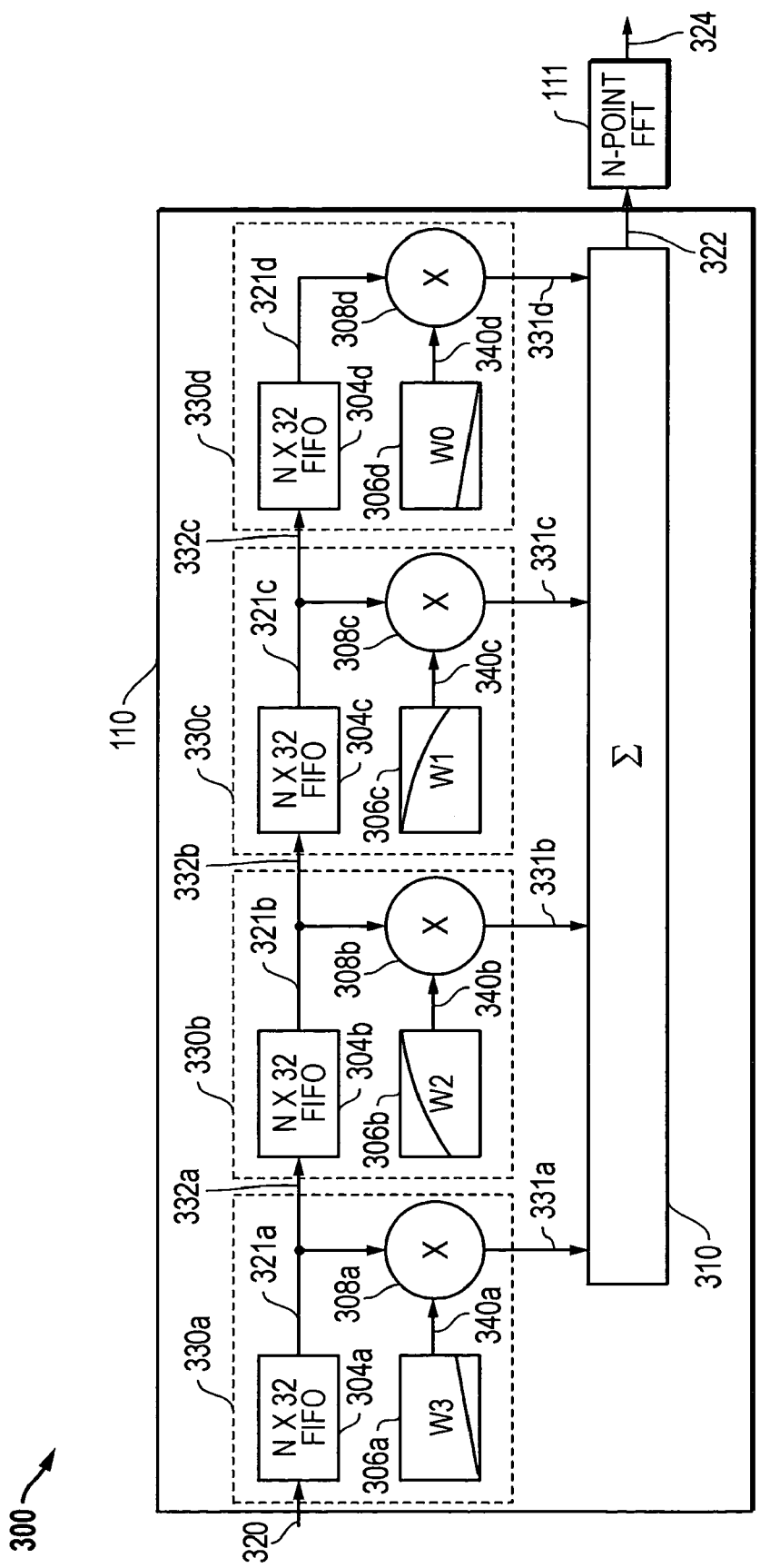
FIG. 3 is a block diagram of a polyphase WOLA FFT implementation according to one exemplary embodiment of the disclosed systems and methods.

FIG. 3 illustrates a block diagram showing notional architecture 300 for a fourth order polyphase WOLA FFT implementation according to one exemplary embodiment of the disclosed systems and methods. The exemplary architecture 300 of FIG. 3 may be implemented, for example, as polyphase WOLA FFT processing circuitry 116 of FIG. 1, and may include WOLA processor 110 and N-point FFT processor 111 as shown. As shown, WOLA processor 110 of FIG. 3 includes four WOLA sub-modules 330a through 330d, the outputs of which are each coupled to summer 310 for summation during each calculation cycle of WOLA processor 110. Each of WOLA sub-modules 330 is coupled to receive a new N-bit sample input frame 204 during each calculation cycle, and to output a previously stored sample input frame 204 during each calculation cycle. In this regard, WOLA sub-module 330a is coupled to receive a new sample input frame 204 from input data 320 (e.g., sample input frames from received RF digital signal 105 of FIG. 1) during each calculation cycle, and to output a previously stored sample input frame 204 to WOLA sub-module 330b during each calculation cycle as a WOLA sub-module output 332. Similarly, each of WOLA sub-modules 330b through 330d are coupled to receive new sample input frames 204 from a WOLA sub-module output 332 provided by the immediately preceding WOLA sub-module 330 during each calculation cycle, and to output a previously stored sample input frame 204 during each calculation cycle as a WOLA sub-module output 332. In this manner, a given sample input frame may be sequentially processed by WOLA sub-modules 330a through 330d during successive calculation cycles.

Still referring to the exemplary embodiment of FIG. 3, each of WOLA sub-modules 330 includes an exemplary-sized N×32 FIFO buffer 304 that is coupled to receive and temporarily store a new sample input frame 204 during each calculation cycle, and to output a previously-stored sample input frame 204 during the same calculation cycle as FIFO output 321. Each WOLA submodule 330 is in turn configured to output the newly stored sample input frame 204 during the immediately following calculation cycle, at which time another new sample input frame 204 is received and stored. In this regard, FIFO 304a is coupled to receive a new sample input frame 204 from input data 320, and each of FIFOs 304b through 304d are coupled to receive new sample input frames 204 output by a FIFO 304 of a preceding WOLA sub-module 330. Each given WOLA sub-module 330 also includes a multiplier 308 coupled to the FIFO output of the same given WOLA sub-module 330 and to a respective weight value source 306 (e.g., memory or other suitable source of a weight value) of the same given WOLA sub-module 330. During each calculation cycle, each multiplier 308 of a given WOLA sub-module 330 is configured to multiply a given sample input frame output (as FIFO output 321) by the FIFO of the same given WOLA sub-module 330 with a weight value 340 received from the weight value source 306 of the same given WOLA sub-module 330, and to output the product as a weighted sample or windowed output 331 to summer 310 for summation. As so configured in this embodiment, WOLA processor 110 represents an analysis window for an exemplary fourth order WOLA, it being understood that any other number of WOLA sub-modules (e.g., greater than four, or less than four) may be alternatively present in a WOLA processor 110 of other embodiments.

In one exemplary embodiment, WOLA processor 110 may be configured to process sample input frames 204 of FIG. 2B in the following manner. Each individual sample input frame 204 (e.g., S0, S1, S2, S3, ... $S_n$) of input frame data 320 passes sequentially through each of WOLA sub-modules 330a through 330d, one calculation cycle at time in a manner as previously described. In each WOLA sub-module 330, a given sample input frame 204 is multiplied by a weight value 340 of a corresponding weight value source 306, and the product output as a weighted sample output 331 to summer 310, which sums together the windowed samples 331a through 331d obtained from WOLA sub-modules 330a through 330d, respectively, during the same calculation cycle. The resulting sum 322 is then provided to FFT processor 111 for further processing. In this manner, four sample input frames (e.g., S0, S1, S2 and S3) may be simultaneously processed during a common calculation cycle within the analysis window of WOLA processor 110.

The architecture 100 shown in FIG. 3 produces an N-point sum which is appropriate for input to an N-point FFT. The WOLA architecture shown is understood to accommodate various combinations of overlap percentages, polyphase orders, and FFT sizes by varying the number of WOLA sub-modules and the FIFO size "N".

Figure 4:
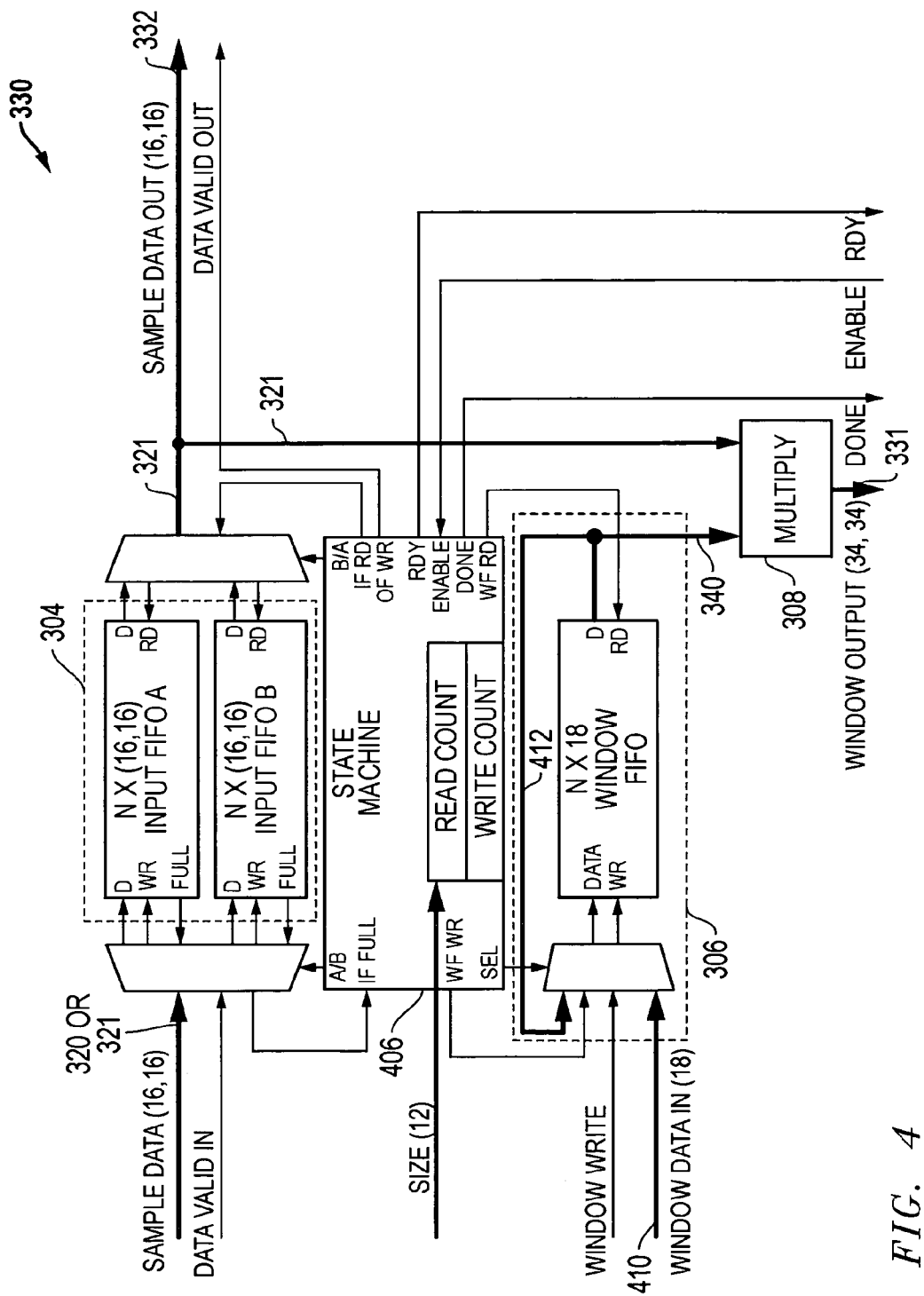
FIG. 4 is a block diagram of a polyphase WOLA sub-module according to one exemplary embodiment of the disclosed systems and methods.

FIG. 4 illustrates a polyphase WOLA sub-module 330 as it may be implemented according to one exemplary embodiment of the disclosed systems and methods, e.g., in IP core logic of ASIC, FPGA, or any other suitable processing device. This embodiment may be particularly advantageous for implementation in an ASIC or FPGA having pre-existing or free FIFO cores. It may also be particularly advantageous for implementation in an ASIC or FPGA because of the repeating modular design which is made possible by the re-use (or replication) of the WOLA sub-module 330. As shown, WOLA sub-module 330 includes FIFO buffer 304 coupled to receive input data 320 (e.g., sample input frames from received RF digital signal 105 of FIG. 1) or a WOLA sub-module output 332 (e.g., sample input frames output from a preceding WOLA sub-module 330), depending on the position of WOLA sub-module 330 in a WOLA processor 110 architecture. In the illustrated exemplary embodiment, FIFO buffer 304 is configured as a double FIFO buffer that includes N×(16,16) Input FIFO A and N×(16,16) Input FIFO B buffers. A WOLA sub-module 332 may be so provided with double FIFO buffers to allow a first sample input frame to be received from a preceding WOLA sub-module 332 and temporarily stored in a first buffer, while a second sample input frame is transferred from a second buffer to a succeeding WOLA sub-module 332. However, it will be understood that any other FIFO buffer configuration (e.g., single buffer, triple buffer, etc.) and/or buffer size (e.g., larger or smaller) may be employed that is suitable for receiving and temporarily storing and outputting sample input frames in a manner as described elsewhere herein.

Still referring to FIG. 4, WOLA sub-module 330 also includes a weight value source 306 that in this exemplary embodiment includes a N×18 Window FIFO that is configured to provide a weight value 340 to multiplier 308 which, in this case, is configured as a Real * Complex Multiplication function for multiplying real window data with complex data. In this embodiment, window FIFO of weight value source 306 may be, for example, a pre-existing or free FIFO core of an ASIC or FPGA. As shown, multiplier 308 provides a windowed output 331, e.g., to a summer 310 (not shown in FIG. 4) for summation as described elsewhere herein. In the illustrated exemplary embodiment, the Window FIFO of weight value source 306 is configured to optionally receive weight value information 410 from a user or other source external to WOLA sub-module 330. In this embodiment, weight value information 410 may be utilized to allow initial weight value information to be provided by a user to weight value source 306 for use in the first calculation cycle of a WOLA processor 110, to allow revised weight value information 410 to be provided by a user to weight value source 306 to change the WOLA analysis window distribution, etc. However, it will be understood that it is not necessary that a weight value source be configured to receive initial and/or revised weight value information, e.g., a weight value source may alternatively be pre-configured with a weight value range in permanent memory that is not changeable.

Still referring to FIG. 4, weight value source 306 is shown configured with optional weight value recycle loop 412 that allows a previously supplied weight value range to be continuously and automatically cycled through the Window FIFO of weight value source 306. When implemented in an ASIC or FPGA having pre-existing FIFO cores, optional weight value recycle loop 412 may be advantageously provided so that the IP core of the ASIC or FPGA does not have to repeatedly provide a weight value range to weight value source 306.

Also shown provided in FIG. 4 is FIFO controller 406 provided in the form of a state machine for controlling read and write operations of FIFO components of WOLA sub-module 330, e.g., FIFO buffer 304 and Window FIFO of weight value source 306 in a manner as described elsewhere herein. Tasks of FIFO controller 406 may be performed in one embodiment by hardware description language (HDL) code such as very high speed integrated circuit (VHSIC) hardware description language or VHDL code executing as a module on an ASIC or FPGA. However, operation of FIFO components of WOLA sub-module 330 may be controlled in any other suitable manner, e.g., using control signals supplied by control source internal or external to WOLA sub-module 330.

Figure 5:
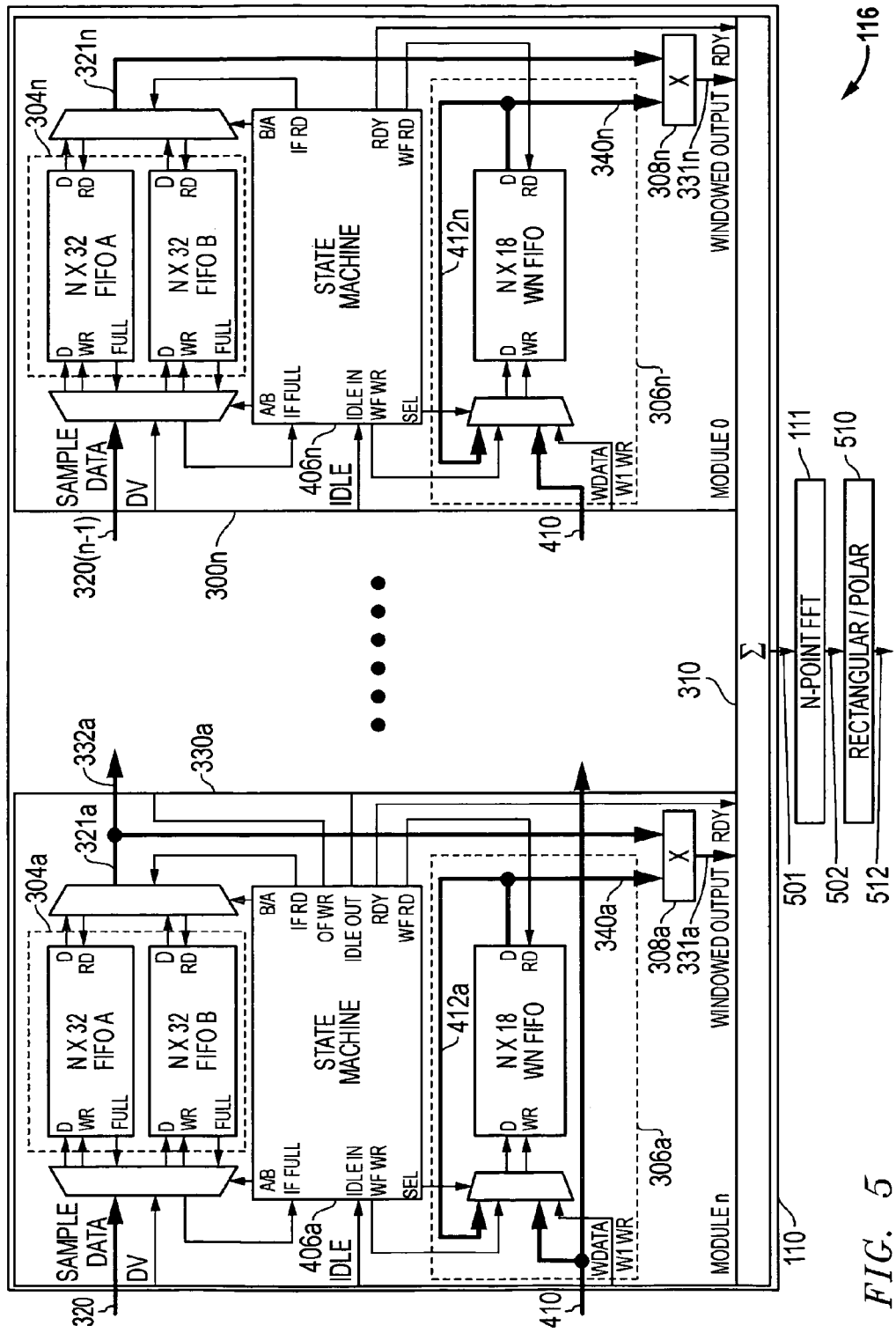
FIG. 5 is a block diagram of a polyphase WOLA FFT implementation according to one exemplary embodiment of the disclosed systems and methods.

FIG. 5 illustrates one exemplary embodiment of $n^{th}$ order polyphase WOLA FFT processing circuitry 116 that may be implemented with a WOLA processor 110 using a number "n" of multiple WOLA sub-modules 330, labeled as 330a through 330n for the embodiment of FIG. 5. As illustrated in FIG. 5, each of WOLA sub-modules 330a through 330n are coupled to provide a windowed sample 331 to summer 310. Summer 310 is coupled to provide the sum 501 of windowed samples 331a through 331n to FFT processor 111 as shown. FFT processor 111 provides FFT-processed data 502 to Rectangular/Polar processor 510 which in turn provides a magnitude-squared output 512 to further processing circuitry such as the DSP post-processor 114 in FIG. 1. In the embodiment of FIG. 5, any number "n" of two or more WOLA sub-modules 330 may be operatively coupled together in a manner suitable for implementing WOLA processing circuitry 116 in a manner as described herein.

Although FIG. 5 illustrates $n^{th}$ order polyphase WOLA FFT processing circuitry that includes multiple WOLA sub-modules 330, it will be understood that WOLA processing may be implemented in one embodiment using a single WOLA sub-module 330 (e.g., multiplying a single frame by an entire window to implement zero-order WOLA processing). Alternatively, multiple WOLA submodules may be implemented to achieve zero-order WOLA processing by bypassing summer 310, e.g., four sub-modules 330 may process a quarter at a time and bypass summer 310. A zero-order WOLA implementation may be implemented, for example, to provide the input of a FFT processor with a frame of data multiplied by a window so as to apply an analysis window to an FFT without any polyphase pre-processing.

Figure 6:
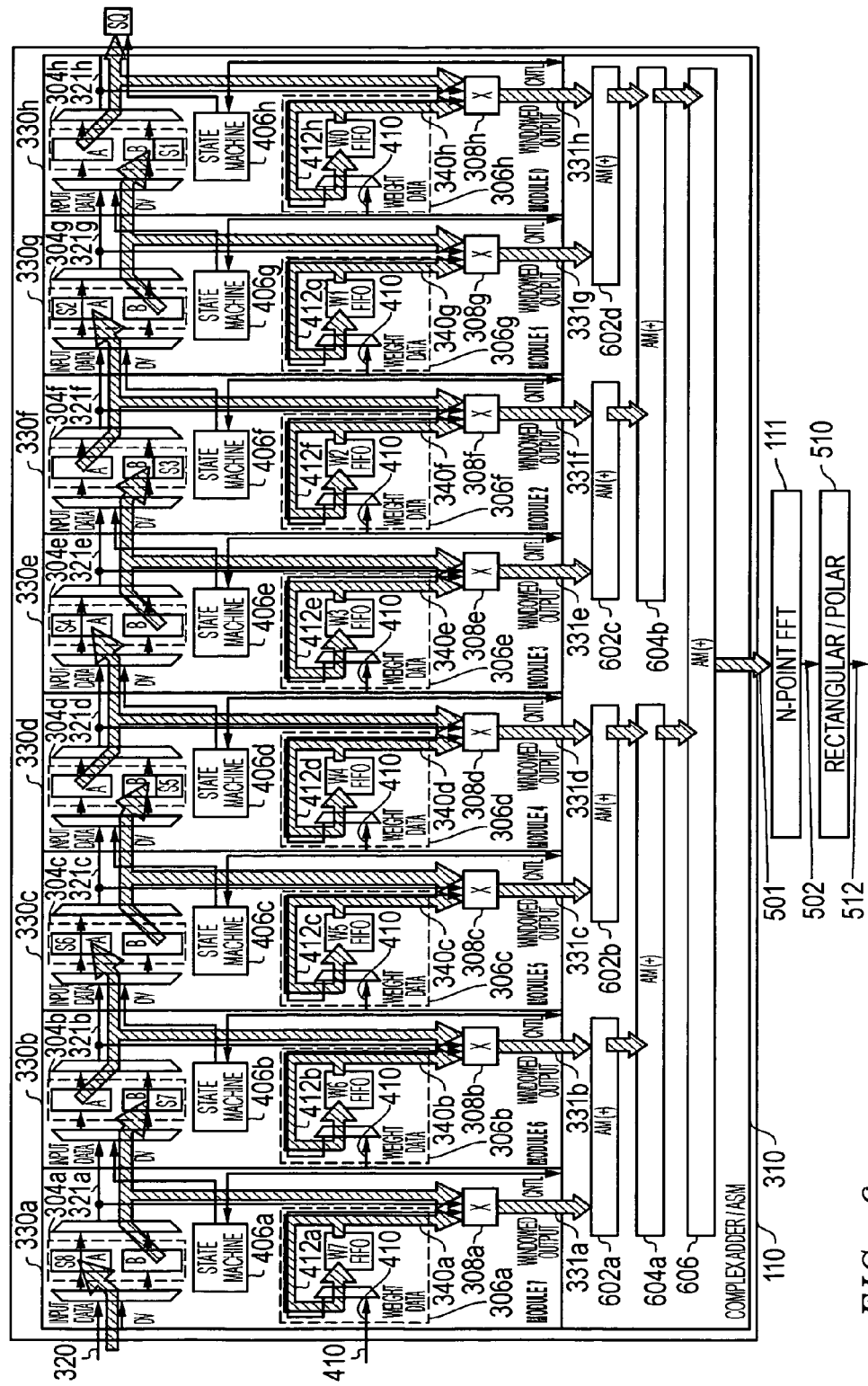
FIG. 6 is a block diagram of a polyphase WOLA FFT implementation according to one exemplary embodiment of the disclosed systems and methods.

FIG. 6 illustrates one exemplary embodiment of an $8^{th}$ order polyphase WOLA FFT processing circuitry 116 that may be implemented with a WOLA processor 110 using eight WOLA sub-modules 330, labeled as 330a through 330h for the embodiment of FIG. 6. Signal paths used to obtain an 87.5% data overlap during one calculation cycle are indicated in FIG. 6 by broad cross hatched arrowed lines. In the calculation cycle illustrated in FIG. 6, sample input frame S8 is received by FIFO A buffer of FIFO buffer 330a, and sample input frame S7 is transferred from FIFO B buffer of FIFO buffer 330a to FIFO B buffer of FIFO buffer 330b. Similar transfers are illustrated occurring for sample input frames S6 through S0 in relation to FIFO buffers 330b through 330h. This lock-step transfer process for sample input frames continues each calculation cycle. With regard to FIG. 6, the output of sample input frame S0 from module 330h is shown for completeness, however it will be understood that S0 may be alternatively discarded at this point, or may be used for subsequent processing.

As illustrated by the broad cross hatched arrowed lines in FIG. 6, each sample input frame is provided to a multiplier 308 of a each given WOLA sub-module 330 at the same time it is transferred from the given WOLA sub-module 330 to the next WOLA sub-module 330 (with the exception of the terminal sub-module 330h which has no succeeding module to which to transfer the sample input frame). During the calculation cycle, a weight value range is also provided to the multiplier 308 of each given module from the Window FIFO of the weight value source 306 of the given module, and the sample input frame multiplied by the weight value range and provided as a windowed sample 331 to summer 310. At the same time, the weight value range is recycled from the output of the Window FIFO to the input of the Window FIFO of the weight value source 306 of each given module.

In the exemplary embodiment of FIG. 6, summer 310 includes first level adder modules 602 that are each coupled to add together the windowed samples 331 received from two WOLA sub-modules 330 during each calculation cycle, second level adder modules 604 that are each coupled to add together the sums received from two first level adder modules 602 during each calculation cycle, and one third level adder module 606 that is coupled to add together the sums received from two second level adder modules 604 and to provide this sum 501 to FFT processor 111 during each calculation cycle.

It will be understood that operation of multiple WOLA sub-modules 330 of a given WOLA processing circuitry 116 configuration may be selectively controlled to vary the polyphase order of WOLA processing. For example, referring to the exemplary embodiment of FIG. 6, eighth order polyphase WOLA processing is achieved by multiplying a sample input frame by a weight value in each given WOLA sub-module 330 during each calculation cycle, and simultaneously transferring the sample input frame from the given WOLA sub-module 330 to the next WOLA sub-module 330. However, in one embodiment other orders of polyphase WOLA processing may be achieved using the exemplary embodiment FIG. 6, or using any other embodiment of WOLA processing circuitry having three or more WOLA sub-modules (i.e., any odd or even number of sub-modules greater than three), by varying the number of WOLA processing modules that process sample input frames during a given calculation cycle. It will also be understood that performance may be varied (e.g., lower-performance variants may be implemented) with other polyphase orders or overlap percentages using the same hardware configuration with a lower input sample rate and a different control strategy.

For example, assume at the beginning of a first calculation cycle that there are eight sample input frames S7 through S0 present in WOLA sub-modules 330a through 330h of WOLA processing circuitry 116, with one sample being present in the FIFO buffer 304 of each WOLA sub-module 330. By only transferring and multiplying a sample input frame (e.g., S6, S4, S2 and S0) by a respective weight value in every other (i.e., alternating) WOLA sub-module 330 during the first calculation cycle, followed by only transferring and multiplying a sample input frame (e.g., S7, S5, S3 and S1) by a respective weight value in every other (i.e., alternating) remaining WOLA sub-module 330 during the next calculation cycle, fourth order polyphase WOLA processing may be achieved so that the sample input frames S7 through S0 of all eight WOLA submodules 330 have been transferred and multiplied by respective weight values after two calculation cycles.

Similarly, in another, embodiment second order WOLA processing may be achieved by only transferring and multiplying a sample input frame (e.g., S4 and S0) by a respective weight value in every fourth WOLA sub-module 330 during a first calculation cycle, followed by only transferring and multiplying a sample input frame (e.g., S5 and S1) by a respective weight value in every fourth of the remaining WOLA sub-modules 330 (e.g., in the adjacent preceding sub-modules) during a second calculation cycle, and continuing in the same manner until the sample input frames S7 through S0 of all eight WOLA submodules 330 have been transferred and multiplied by respective weight values, i.e., after four calculation cycles. A similar methodology may be employed to achieve first order polyphase WOLA processing by only transferring and multiplying a sample input frame by a respective weight value in one WOLA sub-module 330 during a first calculation cycle, followed by only transferring and multiplying a sample input frame by a respective weight value in one of the remaining WOLA sub-modules 330 (e.g., in an adjacent preceding sub-module) during a second calculation cycle, and continuing in the same manner until the sample input frames S7 through S0 of all eight WOLA sub-modules 330 have been transferred and multiplied by respective weight values, i.e., after eight calculation cycles.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A weighted overlap and add (WOLA) sub-module, comprising:
    a first First-In First-Out (FIFO) buffer having an input and an output;
    a weight value source having an output, said weight value source comprising a second FIFO buffer;
    a multiplier having a first input coupled to said output of said first FIFO buffer, a second input coupled to said output of said weight value source, and an output configured to be coupled to a summer; and
    a common FIFO controller coupled to control both of said first FIFO buffer and said second FIFO buffer, said common FIFO controller being a state machine for controlling read and write operations of both of said first FIFO buffer and said second FIFO buffer.

2. The sub-module of claim 1, wherein said first FIFO buffer, said second FIFO buffer of said weight source, said first multiplier, and said state machine of said FIFO controller are implemented in one or more cores of an integrated circuit.

3. The sub-module of claim 2, wherein said first FIFO buffer, said second FIFO buffer of said weight source, said first multiplier, and said state machine of said FIFO controller are implemented in one or more cores of an application specific integrated circuit (ASIC) or field programmable gate array (FPGA).

4. The sub-module of claim 1, wherein said weight value source further comprises an input for receiving revised weight value information form a source external to said sub-module.

5. The sub-module of claim 1, wherein said weight value source has an input; and wherein said weight value source further comprises a recycle path from said output of said weight value source to said input of said weight value source.

6. The sub-module of claim 3, wherein said first FIFO buffer comprises a pre-existing FIFO core of an application specific integrated circuit (ASIC) or a commercial off the shelf (COTS) FPGA.

7. A WOLA processor comprising multiple WOLA sub-modules of claim 1 coupled together, said WOLA sub-modules also being coupled to a summer.

8. A signal processing system, comprising:
    a first weighted overlap and add (WOLA) sub-module, said first WOLA sub-module comprising:
        a first First-In First-Out (FIFO) buffer having an input and an output,
        a first weight value source having an output, and
        a first multiplier having a first input coupled to said output of said first FIFO buffer, a second input coupled to said output of said first weight value source, and an output;
    a second WOLA sub-module, said second WOLA sub-module comprising:
        a second FIFO buffer having an input and an output, said input of said second FIFO buffer being coupled to said output of said first FIFO buffer,
        a second weight value source having an output, and
        a second multiplier having a first input coupled to said output of said second FIFO buffer, a second input coupled to said output of said second weight value source, and an output; and
    a summer having a first input coupled to said output of said first multiplier, a second input coupled to an output of said second multiplier, and an output.

9. The signal processing system of claim 8, wherein said first WOLA submodule, said second WOLA sub-module, and said summer are implemented in one or more cores of an integrated circuit.

10. The signal processing system of claim 9, wherein said first WOLA submodule, said second WOLA sub-module, and said summer are implemented in one or more cores of an application specific integrated circuit (ASIC) or field programmable gate array (FPGA).

11. The signal processing system of claim 10, wherein said first and second FIFO buffers comprise pre-existing FIFO cores of an application specific integrated circuit (ASIC) or a commercial off the shelf (COTS) FPGA.

12. The signal processing system of claim 10, further comprising a fast fourier transform (FFT) processor having an input coupled to said output of said summer; and wherein said first WOLA sub-module, said second WOLA sub-module, said summer; and said FFT processor together comprise polyphase WOLA FFT processing circuitry; and wherein said FFT processor is implemented in one or more cores of said application specific integrated circuit (ASIC) or field programmable gate array (FPGA).

13. The signal processing system of claim 12, wherein said first and second weight value sources each have an input and each comprise a FIFO buffer; wherein said first weight value source further comprises a recycle path from said output of said first weight value source to said input of said first weight value source; and wherein said second weight value source further comprises a recycle path from said output of said second weight value source to said input of said second weight value source.

14. The signal processing system of claim 12, wherein said signal processing system comprises a channelizer that comprises said polyphase WOLA FFT processing circuitry.

15. The signal processing system of claim 14, wherein said signal processing system further comprises:
analog receiver circuitry having an input configured to be coupled to a RF sensor;
an analog to digital converter (ADC) having an input coupled to an output of said analog receiver circuitry; and
wherein said channelizer has an input coupled to an output of said ADC, and has at least one output configured to be coupled to at least one digital signal processor (DSP).

16. The signal processing system of claim 14, wherein said signal processing system further comprises:
analog receiver circuitry having an input configured to receive radio frequency (RF) information from a RF sensor, and an output configured to provide an analog RF signal;
an analog to digital converter (ADC) having an input coupled to receive said analog RF signal from said output of said analog receiver circuitry, and an output configured to provide a digital RF signal corresponding to said analog RF signal; and
wherein said channelizer has an input configured to receive said digital RF signal from said output of said ADC.

17. The signal processing system of claim 8, further comprising:
a third weighted WOLA sub-module, said third WOLA sub-module comprising:
a third First-In First-Out (FIFO) buffer having an input and an output,
a third weight value source having an output, and
a third multiplier having a first input coupled to said output of said third FIFO buffer, a second input coupled to said output of said third weight value source, and an output; and
wherein said summer has a third input coupled to said output of said third multiplier; and
wherein said first, second and third WOLA submodules are coupled to be selectively controlled to vary the polyphase order of WOLA processing by varying the number of WOLA processing submodules that process sample input frames during a given calculation cycle.

18. The signal processing system of claim 8, further comprising:
a third WOLA sub-module, said third WOLA sub-module comprising:
a third First-In First-Out (FIFO) buffer having an input and an output,
a third weight value source having an output, and
a third multiplier having a first input coupled to said output of said third FIFO buffer, a second input coupled to said output of said third weight value source, and an output;
a fourth weighted overlap and add (WOLA) sub-module, said fourth WOLA sub-module comprising:
a fourth First-In First-Out (FIFO) buffer having an input and an output,
a fourth weight value source having an output, and
a fourth multiplier having a first input coupled to said output of said fourth FIFO buffer, a second input coupled to said output of said fourth weight value source, and an output;
wherein said summer has a third input coupled to said output of said third multiplier and a fourth input coupled to said output of said fourth multiplier; and
wherein said summer comprises:
a first first level adder module coupled to add together windowed samples received from outputs of said first and second WOLA sub-modules during each calculation cycle,
a second first level adder module coupled to add together windowed samples received from outputs of said third and fourth WOLA sub-modules during each calculation cycle, and
a first second level adder module coupled to add together the sums received from said first and second first level adder modules during each calculation cycle.

19. The signal processing system of claim 18, further comprising:
a fifth weighted overlap and add (WOLA) sub-module, said fifth WOLA sub-module comprising:
a fifth First-In First-Out (FIFO) buffer having an input and an output,
a fifth weight value source having an output, and
a fifth multiplier having a first input coupled to said output of said fifth FIFO buffer, a second input coupled to said output of said fifth weight value source, and an output;
a sixth weighted overlap and add (WOLA) sub-module, said sixth WOLA sub-module comprising:
a sixth First-In First-Out (FIFO) buffer having an input and an output,
a sixth weight value source having an output, and
a sixth multiplier having a first input coupled to said output of said sixth FIFO buffer, a second input coupled to said output of said sixth weight value source, and an output;
a seventh weighted overlap and add (WOLA) sub-module, said seventh WOLA sub-module comprising:

a seventh First-In First-Out (FIFO) buffer having an input and an output, a seventh weight value source having an output, and a seventh multiplier having a first input coupled to said output of said seventh FIFO buffer, a second input coupled to said output of said seventh weight value source, and an output;

an eighth weighted overlap and add (WOLA) sub-module, said eighth WOLA sub-module comprising:

an eighth First-In First-Out (FIFO) buffer having an input and an output, an eighth weight value source having an output, and an eighth multiplier having a first input coupled to said output of said eighth FIFO buffer, a second input coupled to said output of said eighth weight value source, and an output;

wherein said summer has a fifth input coupled to said output of said fifth multiplier, a sixth input coupled to said output of said sixth multiplier, a sixth input coupled to said output of said sixth multiplier, and a seventh input coupled to said output of said seventh multiplier; and wherein said summer further comprises:

a third first level adder module coupled to add together windowed samples received from outputs of said fifth and sixth WOLA sub-modules during each calculation cycle, a fourth first level adder module coupled to add together windowed samples received from outputs of said fifth and sixth WOLA sub-modules during each calculation cycle, a second second level adder module coupled to add together the sums received from said third and fourth first level adder modules during each calculation cycle, and a third level adder module coupled to add together the sums received from said first and second second level adder modules.

20. A weighted overlap and add (WOLA) processing system, comprising:

a first First-In First-Out (FIFO) buffer configured to temporarily store sample input frames, said first FIFO buffer having an input configured to receive said sample input frames, and an output configured to provide said sample input frames temporarily stored by said first FIFO buffer;

a first multiplier coupled to said output of said first FIFO buffer, said first multiplier being configured to receive a first weight value range from a first weight value source;

a first weight value source, said first weight value source being coupled to said first multiplier, said first weight value source comprising a second FIFO buffer configured to temporarily store said first weight value range, said second FIFO buffer having an input configured to receive said first weight value range, and an output configured to provide said first weight value range to said first multiplier; and a common FIFO controller coupled to control both of said first FIFO buffer and said second FIFO buffer, said common FIFO controller being a state machine for controlling read and write operations of both of said first FIFO buffer and said second FIFO buffer;

wherein said output of said first FIFO buffer is configured to provide said sample input frames temporarily stored by said first FIFO buffer to said first multiplier; and wherein said first multiplier is configured to multiply said sample input frames provided by said first FIFO buffer by said first weight value range to obtain a first product.

21. The system of claim 20, wherein said first weight value source comprises an input for receiving revised weight value information form a source external to said sub-module.

22. The system of claim 21, wherein said first weight value source is configured to recycle said first weight value range provided from said output of said second FIFO buffer to said input of said second FIFO buffer.

23. The system of claim 20, wherein said first FIFO buffer, said second FIFO buffer of said first weight source, said first multiplier, and said state machine are implemented in one or more cores of an application specific integrated circuit (ASIC) or field programmable gate array (FPGA).

24. The system of claim 20, wherein said first FIFO buffer comprises a pre-existing FIFO core of a commercial off the shelf (COTS) FPGA.

25. The system of claim 20, further comprising:

a third FIFO buffer configured to receive and temporarily store sample input frames provided by said first FIFO buffer, said third FIFO buffer having an input coupled to said output of said first FIFO buffer to receive said sample input frames provided by said first FIFO buffer, and said third FIFO buffer having an output to provide said sample input frames temporarily stored by said third FIFO buffer; and a second multiplier coupled to said output of said third FIFO buffer, said second multiplier being configured to receive a second weight value range from a second weight value source;

wherein said output of said third FIFO buffer is configured to provide said sample input frames temporarily stored by said third FIFO buffer to said second multiplier; and wherein said second multiplier is configured to multiply said sample input frames provided by said third FIFO buffer by said second weight value range to obtain a second product.

26. The system of claim 25, further comprising a summer coupled to receive said first product from said first multiplier and said second product from said second multiplier; and wherein said summer is configured to add together said first product and said second product.

27. The system of claim 26, wherein said first FIFO buffer, said second FIFO buffer, said third FIFO buffer, said first and second multipliers, and said summer are implemented in one or more cores of an application specific integrated circuit (ASIC) or field programmable gate array (FPGA).

28. The system of claim 27, wherein said sample input frames comprise a part of a digital RF signal.

29. The system of claim 26, wherein said first, second and third FIFO buffers comprise pre-existing FIFO cores of a commercial off the shelf (COTS) FPGA.

30. A method of performing WOLA processing on sample input frames of a digital signal using a first weighted overlap and add (WOLA) sub-module circuit, said method comprising:

providing said first WOLA submodule circuit comprising:

a first First-In First-Out (FIFO) buffer circuit having an input and an output, a weight value source circuit having an output and comprising a second FIFO buffer circuit, a multiplier circuit having a first input coupled to said output of said first FIFO buffer circuit and a second input coupled to said output of said weight value source circuit and an output configured to be coupled to a summer circuit, and a common FIFO controller circuit coupled to both of said first FIFO buffer circuit and said second FIFO buffer circuit and comprising state machine circuitry;

receiving and temporarily storing a first sample input frame of said digital signal in said first First-In First-Out (FIFO) buffer circuit during a first calculation cycle;

providing said temporarily stored first sample input frame from said first FIFO buffer circuit to said multiplier circuit during a second calculation cycle following said first calculation cycle;

providing a first weight value range from said second FIFO buffer circuit during said second calculation cycle;

multiplying said first sample input frame provided by said first FIFO buffer circuit by said first weight value range received from said weight value source circuit in said multiplier to obtain a first product during said second calculation cycle; and commonly controlling read and write operations of both of said first FIFO buffer circuit and said second FIFO buffer circuit using said state machine circuitry of said FIFO controller circuit for controlling read and write operations of both of said first FIFO buffer circuit and said second FIFO buffer circuit.

31. The method of claim 30, further comprising recycling said first weight value range from an output of said second FIFO buffer circuit to an input of said second FIFO buffer circuit during said second calculation cycle.

32. The method of claim 30, wherein said first FIFO buffer circuit, said second FIFO buffer circuit of said weight source circuit, said multiplier circuit, and said state machine circuitry are implemented in one or more cores of an application specific integrated circuit (ASIC) or field programmable gate array (FPGA).

33. The method of claim 30, wherein said first FIFO buffer circuit comprises a pre-existing FIFO core of a commercial off the shelf (COTS) FPGA.

34. The method of claim 30, further comprising:
providing a second WOLA submodule circuit comprising: a third First-In First-Out (FIFO) buffer circuit having an input and an output, a second weight value source circuit having an output and comprising a fourth FIFO buffer circuit, and a second multiplier circuit having a first input coupled to said output of said third FIFO buffer circuit and a second input coupled to said output of said second weight value source circuit and an output configured to be coupled to a second summer circuit;

receiving and temporarily storing in said third FIFO buffer circuit said first sample input frame of said digital signal provided by said first FIFO buffer circuit during said second calculation cycle;

providing a temporarily stored second sample input frame from said third FIFO buffer circuit to said second multiplier circuit during said second calculation cycle; and multiplying said second sample input frame provided by said third FIFO buffer circuit by a second weight value range received from said second weight value source circuit in said second multiplier circuit to obtain a second product during said second calculation cycle; and commonly controlling read and write operations of both of said third FIFO buffer circuit and said fourth FIFO buffer circuit using said state machine circuitry of said FIFO controller circuit for controlling read and write operations of both of said third FIFO buffer circuit and said fourth FIFO buffer circuit.

35. The method of claim 34, further comprising providing a summer circuit and adding together said first product and said second product with said summer circuit to obtain a sum during said second calculation cycle.

36. The method of claim 35, wherein said first, second, third and fourth FIFO buffer circuits are implemented in one or more cores of an application specific integrated circuit (ASIC) or field programmable gate array (FPGA).

37. The method of claim 36, wherein said sample input frames comprise a part of a digital RF signal: and wherein said method further comprises:
providing an antenna coupled to analog receiver circuitry and an analog to digital converter (ADC) circuit that is coupled to said first WOLA submodule circuit;
receiving RF information with said antenna and providing said received RF information as a received RF signal in analog form to said ADC circuit;
converting said received RF signal to said digital RF signal in said ADC circuit; and
providing said digital RF signal from said ADC circuit to said first WOLA submodule circuit.

38. The method of claim 35, wherein said first, second, third and fourth FIFO buffer circuits comprise pre-existing FIFO cores of a commercial off the shelf (COTS) FPGA.

39. The method of claim 30, further comprising:
providing a second WOLA submodule circuit comprising: a third First-In First-Out (FIFO) buffer circuit having an input and an output, a second weight value source circuit having an output and comprising a fourth FIFO buffer circuit, a second multiplier circuit having a first input coupled to said output of said third FIFO buffer circuit and a second input coupled to said output of said second weight value source circuit and an output configured to be coupled to a second summer circuit, and a second common FIFO controller circuit coupled to both of said third FIFO buffer circuit and said fourth FIFO buffer circuit and comprising state machine circuitry;

receiving and temporarily storing in said third FIFO buffer circuit a second sample input frame of said digital signal provided by said first FIFO buffer circuit during said first calculation cycle;

receiving and temporarily storing in said third FIFO buffer circuit said first sample input frame of said digital signal provided by said first FIFO buffer circuit during said second calculation cycle;

selectively maintaining said second sample input frame in said third FIFO buffer circuit during said second calculation cycle to vary the polyphase order of said WOLA processing; and providing said temporarily stored second sample input frame from said third FIFO buffer circuit to said second multiplier circuit during a third calculation cycle, said third calculation cycle following said second calculation cycle;

multiplying said second sample input frame provided by said third FIFO buffer circuit by a second weight value range received from said second weight value source circuit in said second multiplier circuit to obtain a second product during said third calculation cycle; and commonly controlling read and write operations of both of said third FIFO buffer circuit and said fourth FIFO buffer circuit using said state machine circuitry of said second FIFO controller circuit for controlling read and write operations of both of said third FIFO buffer circuit and said fourth FIFO buffer circuit.

40. A method of performing WOLA processing using a WOLA processing circuit, comprising:
providing a WOLA processing circuit, comprising the following circuitry:
a first weighted overlap and add (WOLA) sub-module, said first WOLA sub-module comprising: a first First-In First-Out (FIFO) buffer having an input and an output, a first weight value source having an output, and a first multiplier having a first input coupled to said output of said first FIFO buffer, a second input coupled to said output of said first weight value source, and an output, a second WOLA sub-module, said second WOLA sub-module comprising: a second FIFO buffer having an input and an output, said input of said second FIFO buffer being coupled to said output of said first FIFO buffer, a second weight value source having an output, and a second multiplier having a first input coupled to said output of said second FIFO buffer, a second input coupled to said output of said second weight value source, and an output, a third WOLA sub-module, said third WOLA sub-module comprising: a third First-In First-Out (FIFO) buffer having an input and an output, a third weight value source having an output, and a third multiplier having a first input coupled to said output of said third FIFO buffer, a second input coupled to said output of said third weight value source, and an output, a fourth weighted overlap and add (WOLA) sub-module, said fourth WOLA sub-module comprising: a fourth First-In First-Out (FIFO) buffer having an input and an output, a fourth weight value source having an output, and a fourth multiplier having a first input coupled to said output of said fourth FIFO buffer, a second input coupled to said output of said fourth weight value source, and an output, and a summer having a first input coupled to said output of said first multiplier, a second input coupled to an output of said second multiplier, a third input coupled to said output of said third multiplier, a fourth input coupled to said output of said fourth multiplier, and an output, said summer also comprising a first first level adder module, a second first level adder module, and a first second level adder module; and adding together windowed samples received from outputs of said first and second WOLA sub-modules to form a sum in said first first level adder module of said summer during each calculation cycle;

adding together windowed samples received from outputs of said third and fourth WOLA sub-modules to form a sum in said second first level adder module of said summer during each calculation cycle; and adding together said sums from said first and second first level adder modules to form a sum in said first second level adder module during each calculation cycle.

41. The method of claim 40, further comprising:
providing additional circuitry so that said WOLA processing circuit further comprises the following circuitry:

a fifth weighted overlap and add (WOLA) sub-module, said fifth WOLA sub-module comprising: a fifth First-In First-Out (FIFO) buffer having an input and an output, a fifth weight value source having an output, and a fifth multiplier having a first input coupled to said output of said fifth FIFO buffer, a second input coupled to said output of said fifth weight value source, and an output, a sixth weighted overlap and add (WOLA) sub-module, said sixth WOLA sub-module comprising: a sixth First-In First-Out (FIFO) buffer having an input and an output, a sixth weight value source having an output, and a sixth multiplier having a first input coupled to said output of said sixth FIFO buffer, a second input coupled to said output of said sixth weight value source, and an output, a seventh weighted overlap and add (WOLA) sub-module, said seventh WOLA sub-module comprising: a seventh First-In First-Out (FIFO) buffer having an input and an output, a seventh weight value source having an output, and a seventh multiplier having a first input coupled to said output of said seventh FIFO buffer, a second input coupled to said output of said seventh weight value source, and an output, an eighth weighted overlap and add (WOLA) sub-module, said eighth WOLA sub-module comprising: an eighth First-In First-Out (FIFO) buffer having an input and an output, an eighth weight value source having an output, and an eighth multiplier having a first input coupled to said output of said eighth FIFO buffer, a second input coupled to said output of said eighth weight value source, and an output, said summer also having a fifth input coupled to said output of said fifth multiplier, a sixth input coupled to said output of said sixth multiplier, a sixth input coupled to said output of said sixth multiplier, and a seventh input coupled to said output of said seventh multiplier, said summer also comprising a third first level adder module, a fourth first level adder module, a second second level adder module, and a third level adder module; and adding together windowed samples received from outputs of said fifth and sixth WOLA sub-modules to form a sum in said third first level adder module during each calculation cycle;

adding together windowed samples received from outputs of said fifth and sixth WOLA sub-modules to from a sum in said fourth first level adder module during each calculation cycle;

adding together said sums from said third and fourth first level adder modules to form a sum in said second second level adder module during each calculation cycle; and adding together said sums from said first and second second level adder modules in said third level adder module during each calculation cycle.

* * * * *

UNITED STATES PATENT AND TRADEMARK OFFICE
CERTIFICATE OF CORRECTION

PATENT NO. : 7,587,441 B2  Page 1 of 1
APPLICATION NO. : 11/170794
DATED : September 8, 2009
INVENTOR(S) : Yancey et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1101 days.

Signed and Sealed this

Twenty-first Day of September, 2010

David J. Kappos
*Director of the United States Patent and Trademark Office*